(12) United States Patent
Hoya

(10) Patent No.: US 11,145,558 B2
(45) Date of Patent: Oct. 12, 2021

(54) MANUFACTURING METHOD OF SEMICONDUCTOR MODULE

(71) Applicant: FUJI ELECTRIC CO., LTD., Kawasaki (JP)

(72) Inventor: Masashi Hoya, Siojiri (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 4 days.

(21) Appl. No.: 16/775,997

(22) Filed: Jan. 29, 2020

(65) Prior Publication Data

US 2020/0312729 A1 Oct. 1, 2020

(30) Foreign Application Priority Data

Mar. 27, 2019 (JP) .............................. JP2019-060956

(51) Int. Cl.
*H01L 25/16* (2006.01)
*H01L 21/66* (2006.01)
*H01L 23/538* (2006.01)

(52) U.S. Cl.
CPC .......... *H01L 22/20* (2013.01); *H01L 23/5386* (2013.01); *H01L 25/16* (2013.01)

(58) Field of Classification Search
CPC ...... H01L 22/20; H01L 23/5386; H01L 25/16
See application file for complete search history.

(56) References Cited

U.S. PATENT DOCUMENTS

| | | |
|---|---|---|
| 10,163,868 B2 | 12/2018 | Horio et al. |
| 2007/0252573 A1* | 11/2007 | Tachibana ................. G05F 3/30 323/313 |
| 2012/0163129 A1* | 6/2012 | Antoine ................ B06B 1/0292 367/138 |
| 2017/0019096 A1* | 1/2017 | Vecino Vazquez .. H03K 17/063 |
| 2017/0077068 A1 | 3/2017 | Horio et al. |
| 2018/0174987 A1 | 6/2018 | Chounabayashi et al. |

(Continued)

FOREIGN PATENT DOCUMENTS

| | | |
|---|---|---|
| JP | 2000-91110 A | 3/2000 |
| JP | 2006-114733 A | 4/2006 |

(Continued)

OTHER PUBLICATIONS

"Laser Trimming Technology", p. 27-31 (Toshiba Tec Corporation/Toshiba Lighting & Technology Corp. vol. 5, No. 3).

*Primary Examiner* — Fernando L Toledo
*Assistant Examiner* — Neil R Prasad

(57) ABSTRACT

A manufacturing method of a semiconductor module including a trimming resistance element and a plurality of transistor chips connected mutually in parallel, in which gate electrodes are connected to one end of the trimming resistance element, including: measuring elapsed time and a gate-source voltage value when a predetermined gate current is injected into the gate electrodes and a predetermined drain current flow; calculating a gate-source capacity on the basis of the gate-source voltage value; determining a compensation gate resistance value on the basis of the gate-source voltage value and the gate-source capacity; and changing a resistance value of the trimming resistance element such that the resistance value of the trimming resistance element is conformed to the compensation gate resistance value.

9 Claims, 12 Drawing Sheets

(56) References Cited

U.S. PATENT DOCUMENTS

2018/0205372 A1    7/2018  Sasaki
2019/0097563 A1*   3/2019  Shimomugi ......... H03K 17/122

FOREIGN PATENT DOCUMENTS

| | | |
|---|---|---|
| JP | 2010-199362 A | 9/2010 |
| JP | 2010-245248 A | 10/2010 |
| JP | 2017-169145 A | 9/2017 |
| JP | 2017-204575 A | 11/2017 |
| JP | 2018-74088 A | 5/2018 |
| JP | 2018-117457 A | 7/2018 |
| WO | WO 2014/185050 A1 | 11/2014 |

* cited by examiner

MANUFACTURING METHOD OF SEMICONDUCTOR MODULE

CROSS REFERENCE TO RELATED APPLICATIONS AND INCORPORATION BY REFERENCE

This application claims benefit of priority under 35 USC 119 based on Japanese Patent Application No. 2019-060956 filed on Mar. 27, 2019, the entire contents of which is incorporated by reference herein.

TECHNICAL FIELD

The present invention relates to a manufacturing method of a semiconductor module, and, in particular, relates to a technology effectively applied to a manufacturing method of a semiconductor module in which multiple transistor chips are connected in parallel to form switching elements.

BACKGROUND ART

In a power semiconductor device such as an inverter device for converting DC power into AC power, a one element-package (1 in 1) type semiconductor unit in which a pair of a semiconductor switching element and a rectifier element is mounted (hereinafter, referred to as "one element semiconductor unit") or a two elements-package (2 in 1) type semiconductor module in which two one element semiconductor units are mounted (hereinafter, referred to as "two elements semiconductor module") is used.

Examples of patent literature related to the present invention include the followings.

JP 2018-74088 A discloses a 2 in 1 type semiconductor module, and describes a technology of adjusting a gate resistance without providing a chip resistor on a gate wiring by connecting control terminals of multiple semiconductor chips connected in parallel to one control external connection pin and connecting one set of the multiple semiconductor chips and the one control pin in parallel to a gate driver unit.

JP 2010-245248 A describes a semiconductor device in which a loss compensating part 1 is connected in series to a conductive path between a control terminal of an IGBT as a switching element and an external connection part (lead frame for external circuit connection), and states that the loss compensating part is formed by a trimming resistor and a diode.

JP 2010-199362 A describes a method for reducing a difference in electrical characteristics among semiconductor chips and installing the semiconductor chips, and states that, as the electrical characteristics, forward voltages VF of parasitic diodes of power MOSFETs are made close to each other.

JP 2017-204575 A describes a technology of manufacturing a power module by, among combinations in which each difference of an on-voltage of a first chip (SiC-MOSFET), an on-voltage of a second chip (SiC-MOSFET), and a forward voltage of a built-in diode is within a predetermined threshold value, selecting a combination of mounting chips, in which the on-voltage of the second chip is higher compared to the on-voltage of the first chip and the forward voltage of the built-in diode and the forward voltage of the built-in diode is low, and mounting the selected chips on the same insulating substrate.

JP 2018-117457 A describes a power semiconductor module including a high-voltage IGBT and a drive circuit including a gate driver that on/off-drives the IGBT, and states that a resistance value of a gate resistance in a variable resistance circuit connected to a gate of the IGBT is set in consideration of loss and voltage surge of the IGBT in an IGBT normal operating state.

JP 2017-169145 A describes a circuit in which a gate of a MOSFET is connected to an adjustment unit in which multiple pairs of a resistance element and a switch connected in series are connected in parallel, and describes a technology of changing a gate resistance value by the switches.

JP 2000-91110 A describes a technology of adjusting a voltage by cutting a trimming resistor connected to a gate electrode of a semiconductor element.

JP 2006-114733 A discloses a technology of adjusting a voltage by cutting a resistor formed on a semiconductor substrate to be capable of being trimmed.

WO 2014/185050 describes a 2 in 1 type semiconductor module, and describes a technology of exerting a current bypass effect by electrically connecting a circuit impedance element between a gate electrode and a source electrode.

"Laser Trimming Technology", p. 27-31 (Toshiba Tec Corporation/Toshiba Lighting & Technology Corp. Vp. 5 No. 3) states that a resistor is cut by laser while putting a probe on electrodes connected to both ends of the resistor and monitoring a resistance value.

SUMMARY OF INVENTION

Transistor chips are obtained by individually dividing multiple chip-forming regions formed on a semiconductor wafer, but gate threshold voltage characteristics (Vgs(th)) of the transistor chips vary due to a manufacturing variation even in one semiconductor wafer.

Thus, in a semiconductor module used for a half-wave rectifier circuit, in order to prevent a malfunction due to oscillation of drain and gate voltages during switching, the gate threshold voltage characteristics of transistor chips used in one arm are unified to be within a predetermined range.

However, an increase in the number of manufacturing steps such as characteristic sorting, identification, and inventory management of the transistor chips is concerned, thereby causing an increase in manufacturing cost of the semiconductor module.

The present invention was made in view of the problem of the prior arts described above, and it is an object of the present invention to provide a technology capable of reducing manufacturing cost of a semiconductor module.

In order to achieve the object mentioned above, according to an aspect of the present invention, there is provided a manufacturing method of a semiconductor module including a trimming resistance element and a plurality of transistor chips connected mutually in parallel, in which gate electrodes are connected to one end of the trimming resistance element, including: measuring elapsed time and a gate-source voltage value (Vgs(th)u) when a predetermined gate current is injected into the gate electrodes and a predetermined drain current flow; calculating a gate-source capacity (Cgsu) on the basis of the gate-source voltage value; determining a compensation gate resistance value on the basis of the gate-source voltage value and the gate-source capacity; and changing a resistance value of the trimming resistance element such that the resistance value of the trimming resistance element is conformed to the compensation gate resistance value.

Further, according to another aspect of the present invention, there is provided a manufacturing method of a semiconductor module for manufacturing a plurality of semiconductor modules each including a trimming resistance element, a plurality of transistor chips connected mutually in parallel, in which gate electrodes are connected to one end of the trimming resistance element, and a substrate on which the plurality of transistor chips are mounted, including: measuring gate threshold voltages of the plurality of transistor chips before being mounted on the substrate; sorting the number of the plurality of transistor chips whose differences of the gate threshold voltages are within a predetermined range, which is required for being mounted on the substrate; mounting the plurality of transistor chips sorted in the sorting on the substrate; and changing a resistance value of the trimming resistance element such that gate threshold voltage arrival time of the plurality of transistor chips mounted on the substrate during a switching operation is common among the plurality of semiconductor modules.

According to the present invention, manufacturing cost of a semiconductor module can be reduced.

DETAILED DESCRIPTION

Figure 1:
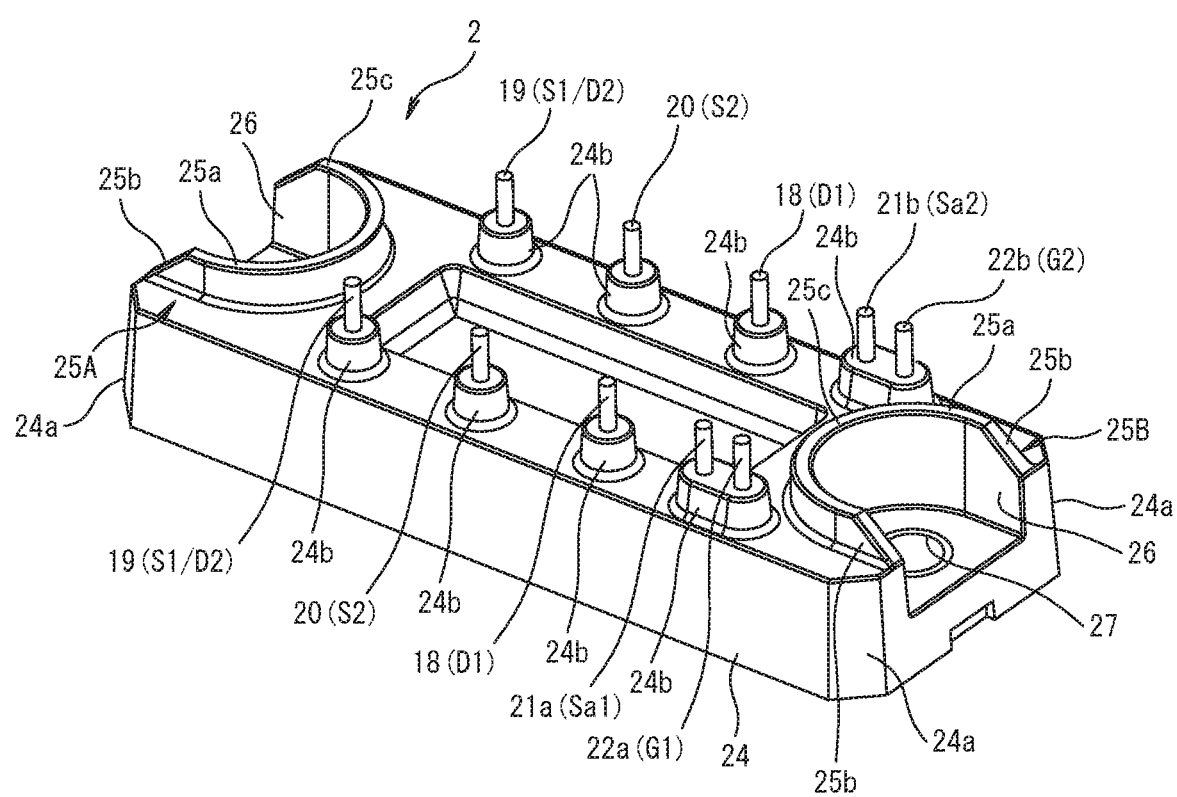
FIG. 1 is a perspective view illustrating an outer structure of a semiconductor module according to an embodiment of the present invention.

Hereinafter, embodiments of the present invention will be described with reference to the drawings. In the description of the drawings, the same or similar portions are assigned the same or similar reference signs, without redundant description. However, the drawings are schematic, and it should be noted that a relationship between a thickness and a planar dimension, a ratio of a thickness of each of layers, and the like are different from actual values. Moreover, it is possible that portions different in mutual dimensional relationships and ratios are shared also among the drawings.

Further, the embodiments as described below are to illustrate a device or a method for embodying the technical idea of the present invention, and the technical idea of the present invention is not to specify a material, a shape, a configuration, a disposition, and the like of a constituting component as those described below.

In the present description, a "first main electrode region" or a "third main electrode region" of a semiconductor element forming a transistor chip means a semiconductor region that becomes a source region or a drain region in a field-effect transistor (FET) or a static induction transistor (SIT). The "first main electrode region" or the "third main electrode region" means a semiconductor region that becomes an emitter region or a collector region in an insulated gate bipolar transistor (IGBT). In addition, the "first main electrode region" or the "third main electrode region" means a semiconductor region that becomes an anode region or a cathode region in a static induction thyristor (SI thyristor) or a gate turnoff thyristor (GTO). A "second main electrode region" or a "fourth main electrode region" of the semiconductor element forming the transistor chip means a semiconductor region that becomes a source region or a drain region, which is not the above first main electrode region, in the FET or the SIT. The "second main electrode region" or the "fourth main electrode region" means a region that becomes an emitter region or a collector region, which is not the above first main electrode region, in the IGBT. The "second main electrode region" or the "fourth main electrode region" means a region that becomes an anode region or a cathode region, which is not the above first main electrode region, in the SI thyristor or the GTO. Therefore, when the "first main electrode region" or the "third main electrode region" is a source region, the "second main electrode region" or the "fourth main electrode region" means a drain region. When the "first main electrode region" or the "third main electrode region" is an emitter region, the "second main electrode region" or the "fourth main electrode region" means a collector region. When the "first main electrode region" or the "third main electrode region" is an anode region, the "second main electrode region" or the "fourth main electrode region" means a cathode region. When a bias relation is reversed, functions of the "first main electrode region" or the "third main electrode region" can be replaced with functions of the "second main electrode region" or the "fourth main electrode region" in many cases.

In the present description, a source region of a MIS transistor is "one main electrode region (first or third main electrode region)" that can be selected as an emitter region of an insulated gate bipolar transistor (IGBT). In addition, in a thyristor such as a MIS-controlled static induction thyristor (SI thyristor), one main electrode region can be selected as a cathode region. A drain region of the MIS transistor is "the other main electrode region (second or fourth main electrode region)" of a semiconductor device, which can be selected as a collector region in the IGBT or as an anode region in the thyristor.

The present embodiment describes the case where the present invention is applied to a (2 in 1) type semiconductor module.

Figure 2:
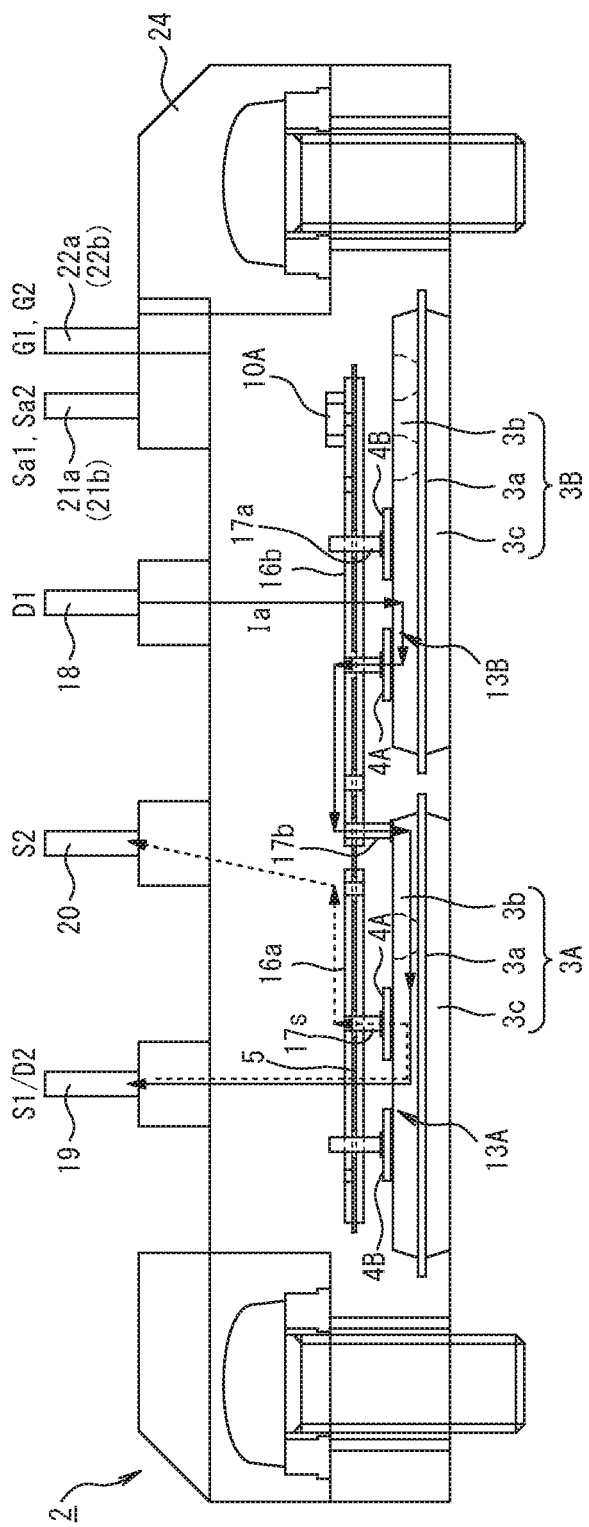
FIG. 2 is a schematic cross-sectional view illustrating an internal structure of the semiconductor module of FIG. 1.
Figure 4A:
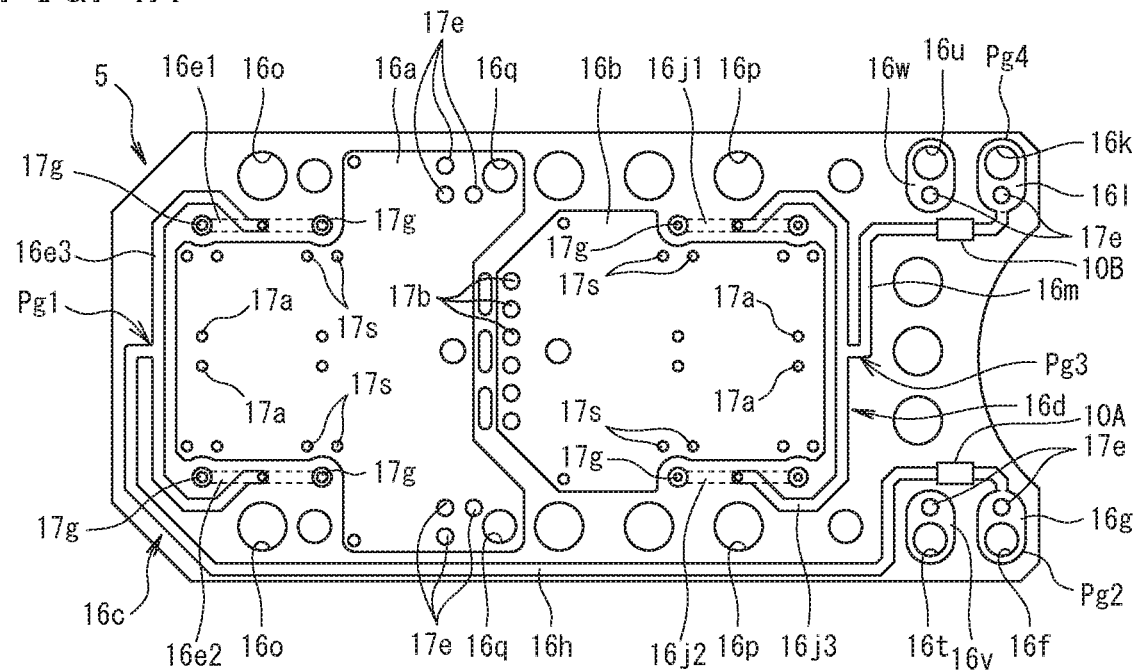
FIG. 4A is a plan view and FIG. 4B is a bottom view illustrating a wiring substrate of FIG. 2.

As illustrated in FIG. 2, a semiconductor module 2 according to the present invention includes insulating substrates 3A, 3B, transistor chips 4A, diode chips 4B, a wiring substrate 5, cylindrical conductive posts 17a, 17b, 17s, and trimming resistance elements 10A, 10B (refer to FIG. 4A). The semiconductor module 2 is formed by a 2 in 1 type including two semiconductor units and can be used as a half-wave rectifier circuit, in which one semiconductor unit is used as an upper arm 13B and the other semiconductor unit is used as a lower arm 13A. Moreover, the semiconductor module 2 according to the present invention includes a resin seal 24 that seals the insulating substrates 3A, 3B, the transistor chips 4A, the diode chips 4B, the wiring substrate 5, the cylindrical conductive posts 17a, 17b, 17s, the trimming resistance elements 10A, 10B, and the like. The resin seal 24 is formed by, for example, a thermosetting insulating resin.

The transistor chips 4A are switching elements such as power MOSFETs or IGBTs. The diode chips 4B are freewheeling diodes (FWDs) connected in inverse parallel to the transistor chips 4A.

Figure 3A:
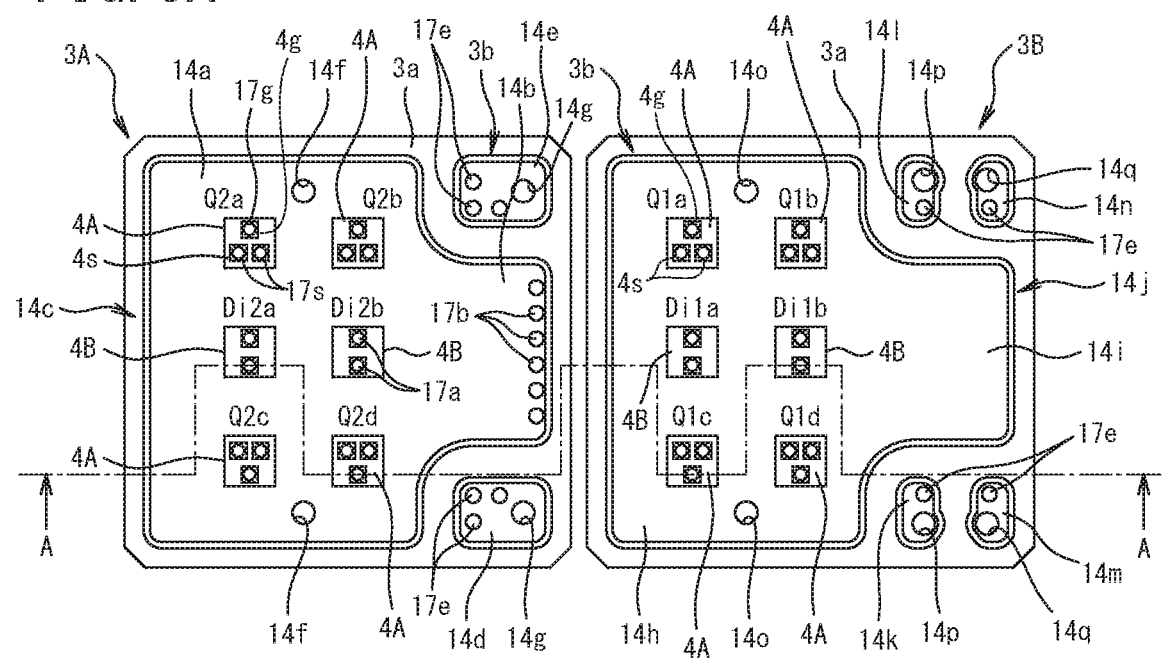
FIG. 3A is a plan view.

As illustrated in FIG. 3A, two diode chips 4B are arranged at a predetermined interval on the center line of each of the insulating substrates 3A, 3B in a longitudinal direction. Moreover, four transistor chips 4A are arranged at predetermined intervals on the both lateral sides of the diode chips 4B. The four transistor chips 4A are connected in parallel to form a switching element Q (refer to FIG. 8). Moreover, the two diode chips 4B are connected in parallel to form a rectifier element Di (refer to FIG. 8).

Figure 3B:
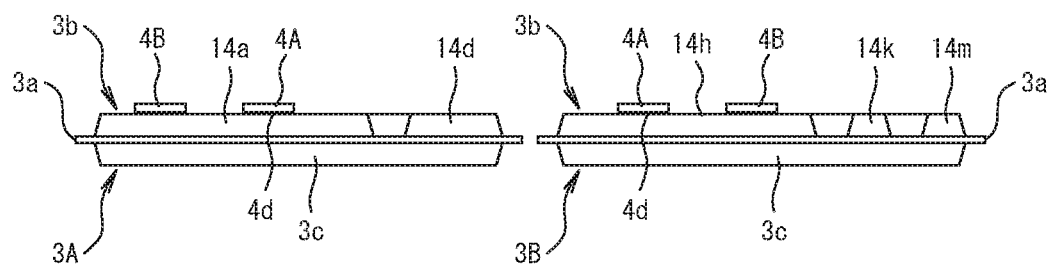
FIG. 3B is a side view.
Figure 3C:
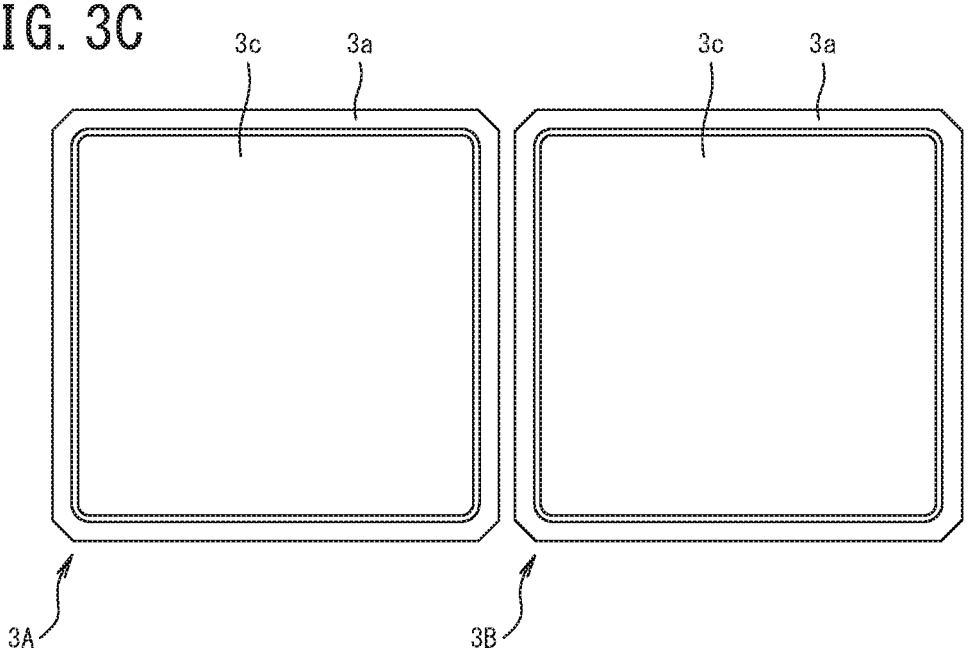
FIG. 3C is a bottom view illustrating an insulating circuit substrate of FIG. 2.

As illustrated in FIGS. 3A and 3B, the transistor chip 4A has a drain electrode 4d as a first main electrode on the rear surface side and a source electrode 4s as a second main electrode and a gate electrode 4g on the front surface side. The gate electrode 4g is arranged on the end side opposite to the diode chip 4B. Moreover, the diode chip 4B has a cathode electrode on the rear surface side and an anode electrode on the front surface side.

The transistor chip 4A and the diode chip 4B are various power devices as described above and may be formed on a silicon substrate or may be formed on a SiC substrate or another substrate. In the present embodiment, for example, SiC chips mainly formed of a compound semiconductor substrate made of silicon carbide are used as the transistor chip 4A and the diode chip 4B.

The insulating substrate 3A has a rectangular insulating plate 3a, a circuit plate 3b fixed to a main surface of the insulating plate 3a, and a metal plate 3c fixed to a rear surface of the insulating plate 3a, which is opposite to the main surface.

As illustrated in FIG. 3A, the circuit plate 3b of the insulating substrate 3A has a third circuit plate 14c for a drain electrode, which includes a wide portion 14a and a narrow portion 14b and has a T-shaped planar shape.

Moreover, the circuit plate 3b has second circuit plates 14d, 14e for a source electrode, which are arranged at a predetermined interval on the lateral sides of the narrow portion 14b.

The drain electrode of the transistor chip 4A and the cathode electrode of the diode chip 4B are electrically and mechanically connected to the third circuit plate 14c. Holes 14f into which external terminals 19 that become S1/D2 terminals are press-fitted are provided in the third circuit plate 14c. Moreover, holes 14g into which external terminals 20 that become S2 terminals are press-fitted are provided in the second circuit plates 14d, 14e.

In addition, similarly to the insulating substrate 3A, the insulating substrate 3B also has an insulating plate 3a, a circuit plate 3b, and a metal plate 3c. The circuit plate 3b of the insulating substrate 3B has a third circuit plate 14j for a drain electrode, which includes a wide portion 14h and a narrow portion 14i and has a T-shape. Furthermore, the circuit plate 3b of the insulating substrate 3B has circuit plates 14k, 14l, 14m, 14n arranged at predetermined intervals on the lateral sides of the narrow portion 14i of the third circuit plate 14j. Among them, the circuit plates 14k, 14l are fourth circuit plates for an auxiliary source electrode, and the circuit plates 14m, 14n are first circuit plates for a gate electrode.

The drain electrode of the transistor chip 4A and the cathode electrode of the diode chip 4B are electrically and mechanically connected to the third circuit plate 14j. Holes 14o into which external terminals 18 that become D1 terminals are press-fitted are provided in the third circuit plate 14j. Moreover, holes 14p into which external terminals 21a, 21b that become SS1, SS2 terminals are press-fitted are provided in the fourth circuit plates 14k, 14l. Furthermore, holes 14q into which external terminals 22a, 22b that become G1, G2 terminals are press-fitted are provided in the first circuit plates 14m, 14n.

The external terminals 18, 19, 20, 21a, 21b, 22a, 22b are preferably made of a copper-based or aluminum-based material having excellent conductivity. Furthermore, when being bonded to the circuit plate 3b by solder, surface treatment on the external terminals 18, 19, 20, 21a, 21b, 22a, 22b with a nickel-based or tin-based material is effective.

Figure 5:
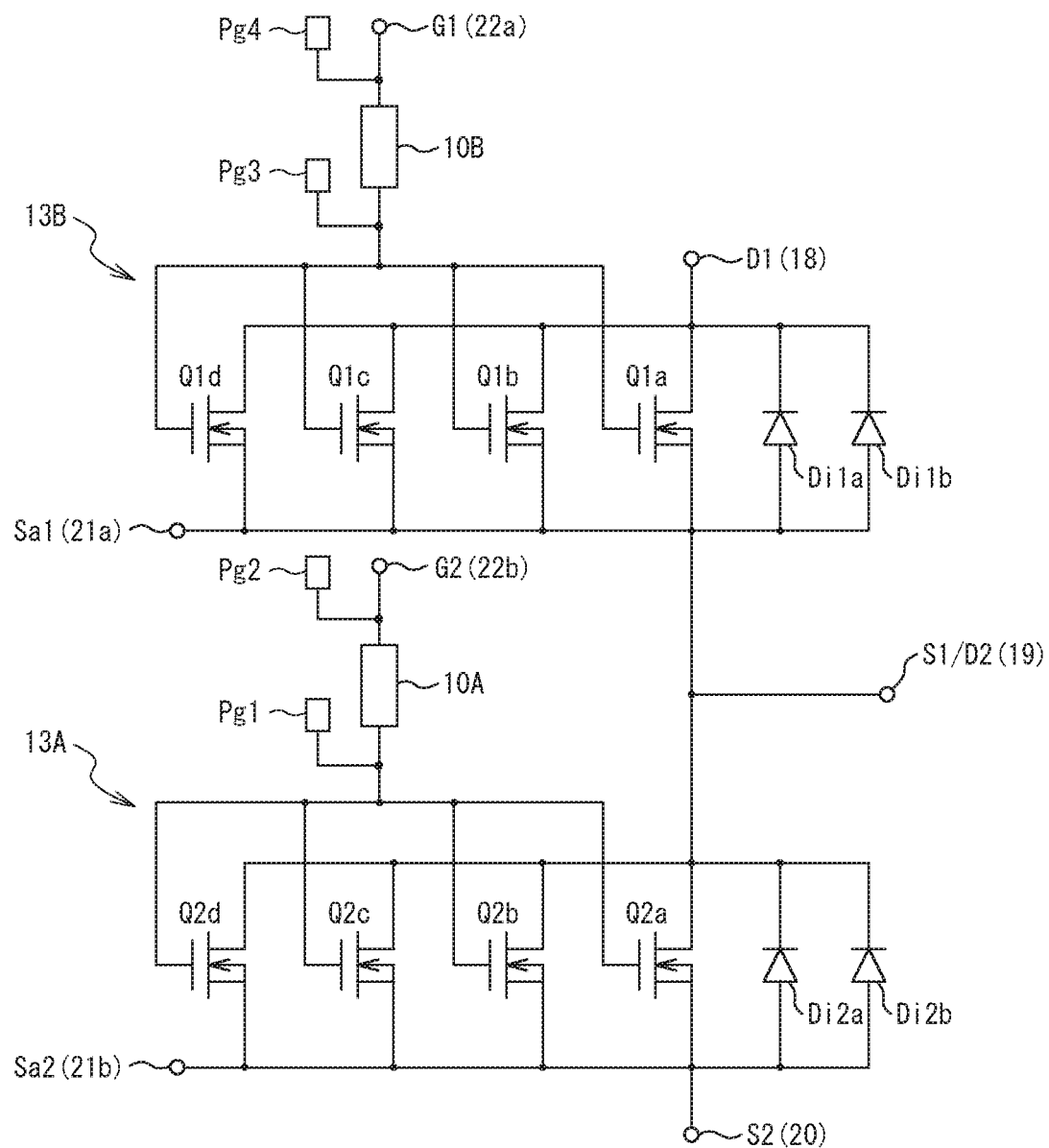
FIG. 5 is a circuit connection diagram of the semiconductor module of FIG. 2.

As can be seen from an equivalent circuit diagram illustrated in FIG. 5, the transistor chips 4A (MOSFETs Q1a to Q1d) and the diode chips 4B (diodes Di1a, Di1b) forming the upper arm are connected in inverse parallel on the insulating substrate 3B. In addition, the transistor chips 4A (MOSFETs Q2a to Q2d) and the diode chips 4B (diodes Di2a, Di2b) forming the lower arm are connected in inverse parallel on the insulating substrate 3A.

Two inverse-parallel circuits formed on the insulating substrate 3B and the insulating substrate 3A are connected in series through the wiring substrate 5 and the conductive posts 17b.

The drain electrodes 4d of the MOSFETs Q1a to Q1d are connected to the external terminals 18 forming the drain terminals D1 of the semiconductor module 2 through the third circuit plate 14j. Moreover, the drain electrodes 4d of the MOSFETs Q2a to Q2d are connected to the external terminals 19 forming the S1/D2 of the semiconductor module 2 through the third circuit plate 14c.

As illustrated in FIG. 1, the external terminals 18, 19, 20 are arranged such that each pair of two external terminals is located symmetric with respect to the center line of the semiconductor module 2 in a width direction. The semiconductor module 2 further has a total of four external terminals 21a, 21b, 22a, 22b on the lateral side of the external terminals 18 in the longitudinal direction, each two of which are arranged on each side. The external terminals 18, 19, 20, 21a, 21b, 22a, 22b are arranged in two rows in a substantially linear fashion along the both edges of the semiconductor module 2.

The external terminals 21a, 21b are auxiliary source terminals and form current detection terminals SS1, SS2 that sense a current flowing between the drain and the source of each of the MOSFETs Q1a to Q1d, Q2a to Q2d. Moreover, the external terminals 22a, 22b form gate terminals G1, G2 that supply a gate control signal to the gate electrode 4g of each of the MOSFETs Q1a to Q1d and the MOSFETs Q2a to Q2d in a half-bridge circuit.

Moreover, the metal plate 3c on the rear surface side of each of the insulating substrates 3A, 3B has a lower surface that is flush with the bottom surface of the insulating resin 24 or slightly protrudes from the bottom surface of the insulating resin 24.

Figure 4B:
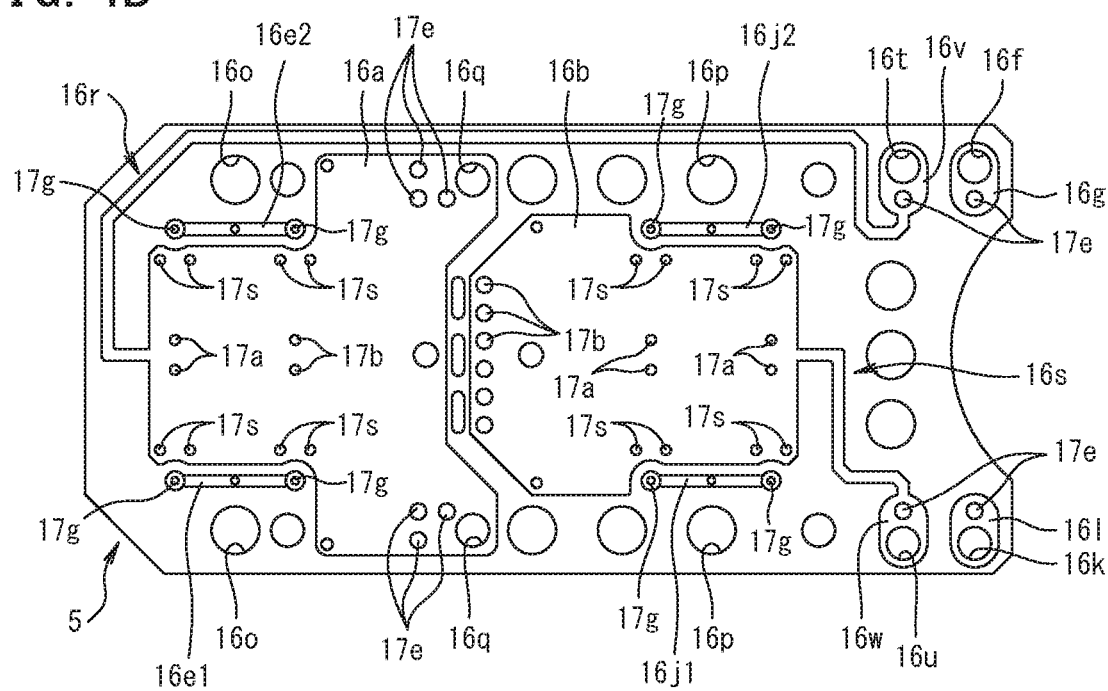

FIG. 4A illustrates a front surface of the wiring substrate 5, and FIG. 4B illustrates a rear surface of the wiring substrate 5. A T-shaped second metal layer 16a that becomes a current path of the lower arm 13A and a second metal layer 16b that becomes a current path of the upper arm 13B are arranged on the wiring substrate 5. The second metal layers 16a, 16b and the source electrodes 4s of the transistor chips 4A of the lower arm 13A and the upper arm 13B are electrically and mechanically connected to both ends of the second conductive posts 17s. The second metal layer 16a on the front surface of the wiring substrate 5 and the second metal layer 16a on the rear surface of the wiring substrate 5 have the same potential, and similarly, the second metal layer 16b on the front surface of the wiring substrate 5 and the second metal layer 16b on the rear surface of the wiring substrate 5 have the same potential.

Moreover, first metal layers 16c, 16d that become control circuits of the lower arm 13A and the upper arm 13B are arranged on the front surface of the wiring substrate 5. The first metal layers 16c, 16d and the gate electrodes 4g of the transistor chips 4A of the lower arm 13A and the upper arm 13B are electrically and mechanically connected to both ends of first conductive posts 17g.

The first metal layer 16c includes first metal layers 16e1, 16e2, 16e3, and 16h.

Moreover, the first metal layer 16d includes first metal layers 16f1, 16f2, 16f3, and 16m.

As illustrated in FIGS. 4A and 4B, the first metal layer 16c is arranged such that the lengths of wires to the gate electrodes 4g of the MOSFETs Q1a to Q1d are equal by the first metal layers 16e1, 16e2. Similarly, the first metal layer 16d is arranged such that the lengths of wires to the gate electrodes 4g of the MOSFETs Q2a to Q2d are equal by the first metal layers 16f1, 16f2.

The wiring substrate 5 has through holes 16o, 16p, 16q through which the external terminals 18, 19, 20 are inserted in a non-contact manner.

Furthermore, second metal layers 16r, 16s that become current paths of the lower arm 13A and the upper arm 13B are arranged on the rear surface of the wiring substrate 5.

The second metal layers 16r, 16s are arranged so as to overlap the first metal layers 16c, 16d on the front surface in a plan view. The second metal layers 16r, 16s are electrically connected to second metal layers 16v, 16w.

As just described, since the first metal layers 16h, 16m, which are gate wirings, and the second metal layers 16r, 16s, which are source wirings, are arranged at positions opposed to each other, the mutual inductance between the both metal layers can be reduced. The reduction in the mutual inductance can stabilize the control of the MOSFETs Q1a to Q1d, Q2a to Q2d.

Moreover, the second metal layer 16b of the wiring substrate 5 is electrically connected to the third circuit plate 14c of the insulating substrate 3A by the multiple conductive posts 17b to form a current path between the lower arm 13A and the upper arm 13B.

Furthermore, the second metal layer 16a of the wiring substrate 5 is electrically connected to the second circuit plates 14d, 14e of the insulating substrate 3A through conductive posts 17e. Moreover, first metal layers 16g, 16l of the wiring substrate are electrically connected to the first circuit plates 14m, 14n of the insulating substrate 3B through the conductive posts 17e. Furthermore, the second metal layers 16v, 16w of the wiring substrate are electrically connected to the fourth circuit plates 14k, 14l of the insulating substrate 3B through the conductive posts 17e.

As illustrated in FIGS. 4A and 4B, the trimming resistance element 10A is inserted and connected in series to the first metal layer 16h. In other words, an electrode of the trimming resistance element 10A on one end side is electrically and mechanically connected to one part of the divided first metal layer 16h, and an electrode of the trimming resistance element 10A on the other end side is electrically and mechanically connected to the other part of the divided first metal layer 16h. The first metal layer 16h is integrally connected to the first metal layer 16e3 on one end side and is integrally connected to the first metal layer 16g on the other end side. The gate electrodes 4g of the multiple transistor chips 4A mounted on the insulating substrate 3A are electrically connected to the electrode of the trimming resistance element 10A on one end side through the first conductive layer 16c and the conductive posts 17g. The first electrode layer 16c and the conductive posts 17g form a branch wire for connecting the gate electrodes 4g of the multiple transistor chips 4A (Q2a to Q2d) forming the lower arm 13A in parallel to one end side of the trimming resistance element 10A. For the sake of convenience, the multiple transistor chips 4A (Q2a to Q2d) forming the lower arm 13A are sometimes referred to as a second transistor chip group.

The trimming resistance element 10B is inserted and connected in series to the first metal wiring 16m. In other words, an electrode of the trimming resistance element 10B on one end side is electrically and mechanically connected to one part of the divided first metal wiring 16m, and an electrode of the trimming resistance element 10B on the other end side is electrically and mechanically connected to the other part of the divided first metal wiring 16m. The first metal layer 16m is integrally connected to the first metal layer 16f3 on one end side and is integrally connected to the first metal layer 16l on the other end side. The gate electrodes 4g of the multiple transistor chips 4A forming the upper arm 13B are electrically connected to the electrode of the trimming resistance element 10B on one end side through the first conductive layer 16d and the conductive posts 17g. The first electrode layer 16d and the conductive posts 17g form a branch wire for connecting the gate electrodes 4g of the multiple transistor chips 4A (Q1a to Q1d) forming the upper arm 13B in parallel to one end side of the trimming resistance element 10B. For the sake of convenience, the multiple transistor chips 4A (Q1a to Q1d) forming the upper arm 13B are sometimes referred to as a first transistor chip group.

A crossed portion of the first metal layer 16h and the first metal layer 16e3 is used as a test pad Pg1 electrically connected to the gate electrodes 4g of the multiple transistor chips 4A forming the lower arm 13A and one end side of the trimming resistance element 10A. The first metal layer 16g is used as a test pad Pg2 electrically connected to the other end side of the trimming resistance element 10A.

A crossed portion of the first metal layer 16m and the first metal layer 16f3 is used as a test pad Pg3 electrically connected to the gate electrodes 4g of the multiple transistor chips 4A forming the upper arm 13B and one end side of the trimming resistance element 10B. The first metal layer 16l is used as a test pad Pg4 electrically connected to the other end side of the trimming resistance element 10B.

Next, a manufacturing method of the semiconductor module 2 will be described using FIGS. 8 to 12 with reference to a flow chart illustrated in FIG. 6.

Figure 6:
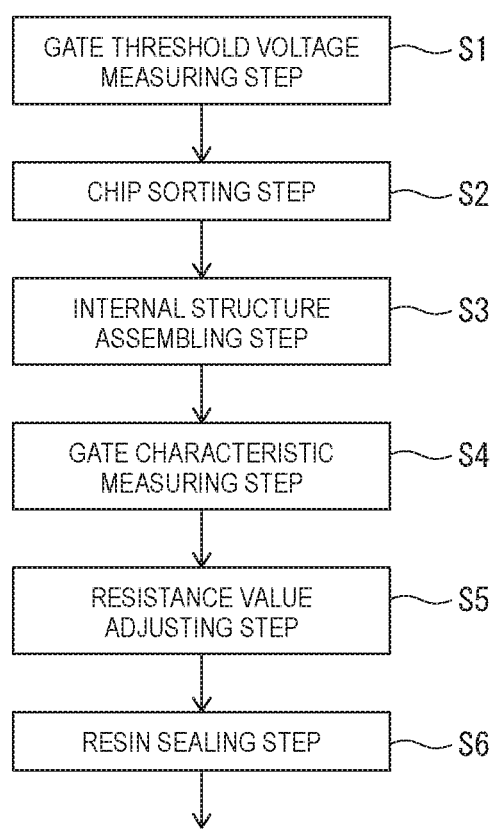
FIG. 6 is a process flow diagram for explaining a manufacturing method of the semiconductor module according to the embodiment of the present invention.

First, in a gate threshold voltage measuring step S1 illustrated in FIG. 6, gate threshold voltages of the multiple transistor chips 4A before being mounted on the insulating substrates 3A, 3B are measured. The measurement of the gate threshold voltages may target at the multiple transistor chips 4A obtained by individually dividing multiple chip-forming regions provided on a semiconductor wafer or may target at the chip-forming regions on the semiconductor wafer.

Next, in a chip sorting step S2 in FIG. 6, the number of the multiple transistor chips 4A whose differences of the gate threshold voltages are within a predetermined range on the basis of the measured gate threshold voltages, which is required for being mounted on the insulating substrates 3A, 3B, is sorted.

Next, in an internal structure assembling step S3 in FIG. 6, an internal structure (assembly structure) in the middle of manufacturing the semiconductor module is assembled using the multiple transistor chips 4A sorted in the chip sorting step S2.

Specifically, first, the ends of the conductive posts 17a, 17b, 17e, 17g, 17s are electrically and mechanically connected to predetermined positions of the wiring substrate 5 prepared in advance. Next, solder paste is applied to mutually separated connection regions of the first metal layer 16h, to which the trimming resistance element 10A is fixed. Furthermore, solder paste is applied to mutually separated connection regions of the first metal layer 16m, to which the trimming resistance element 10B is fixed. The trimming resistance elements 10A, 10B are arranged at predetermined positions of the wiring substrate 5. Concurrently, solder paste is applied to regions on the circuit plates 3b, on which the transistor chips 4A and the diode chips 4B are arranged. Then, as illustrated in FIGS. 3A and 3B, the transistor chips 4A and the diode chips 4B are arranged on the solder paste. After that, solder paste is applied to front surfaces of the transistor chips 4A and the diode chips 4B (portions to which the conductive posts 17a, 17b, 17s are connected). Furthermore, the external terminals 18, 19, 20, 21a, 21b, 22a, and 22b are inserted into predetermined holes provided in the insulating substrates 3A, 3B and are vertically held.

Figure 7:
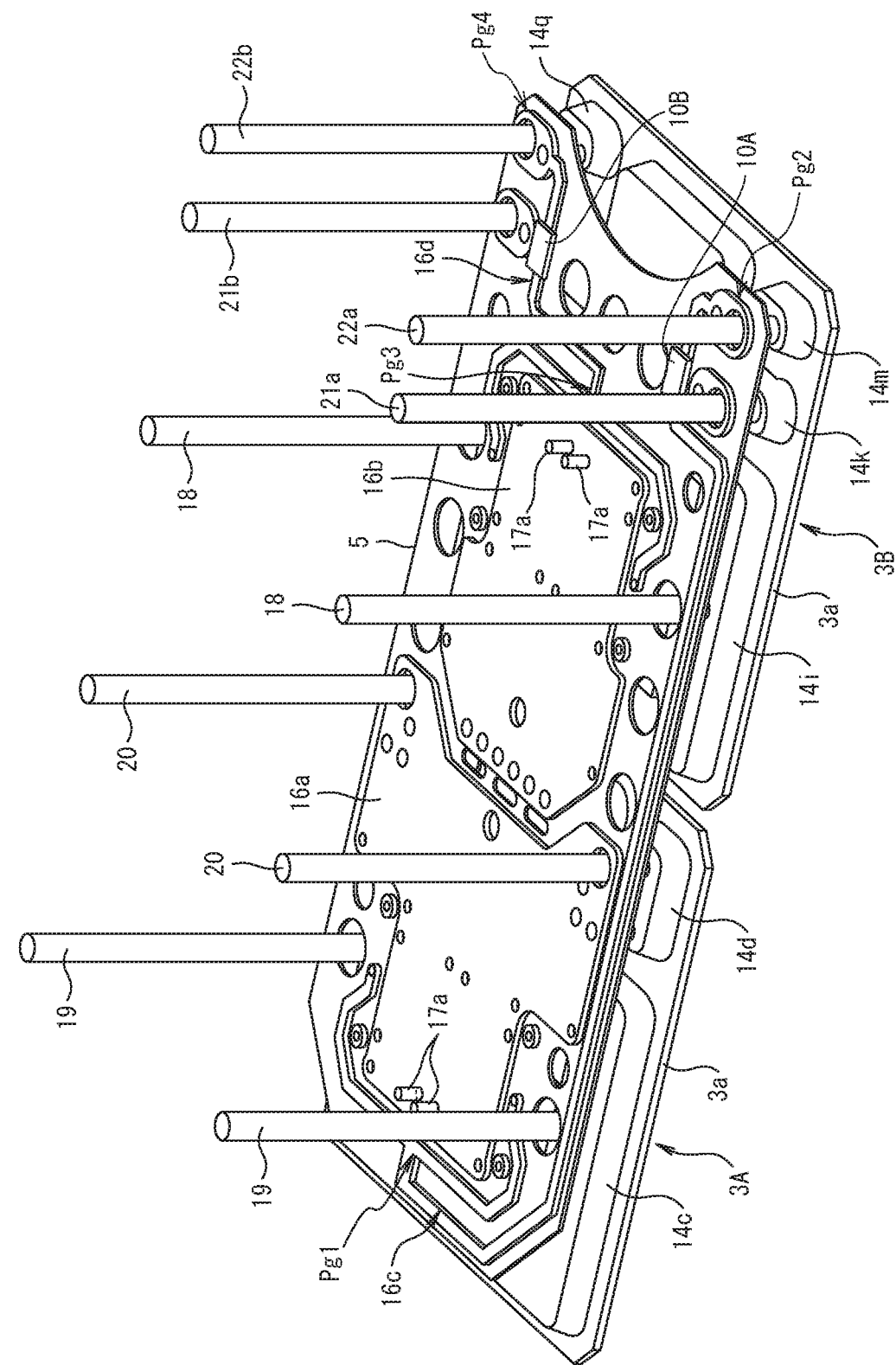
FIG. 7 is a perspective view illustrating a state where the wiring substrate is attached onto the insulating circuit substrate.

Then, as illustrated in FIG. 7, the wiring substrate 5 is arranged on the insulating substrates 3A, 3B such that the conductive posts 17a, 17b, 17e, 17g, 17s are located on the side of the insulating substrates 3A, 3B.

In this state, a reflow process is performed to electrically and mechanically connect the ends of the conductive posts 17a, 17b, 17e, 17g, 17s to the transistor chips 4A, the diode chips 4B, and the circuit plates 3b. Moreover, the electrodes on both ends of the trimming resistance element 10A are electrically connected to the mutually separated connection regions of the first metal layer 16h, respectively. Moreover, the electrodes on both ends of the trimming resistance element 10B are electrically connected to the mutually separated connection regions of the first metal layer 16m, respectively. In other words, the multiple transistor chips 4A and the multiple diode chips 4B are mounted on each of the insulating substrates 3A and 3B. Moreover, the trimming resistance elements 10A and 10B are mounted on the wiring substrate 5.

Next, a gate characteristic measuring step S4 illustrated in FIG. 6 is performed. The step S4 includes a step of measuring elapsed time (t1) when a predetermined gate current is injected into the gate electrodes 4g of the multiple transistor chips 4A and a predetermined drain current (Id=Id (vth)) flow and a gate-source voltage value (Vgs(th)u) at the time, a step of calculating a gate-source capacity (Cgsu) on the basis of the measured gate-source voltage value, and a step of determining a compensation gate resistance value (Rg_set) on the basis of the gate-source voltage value (Vgs(th)u) and the gate-source capacity (Cgsu) after the elapsed time (t1).

Figure 8:
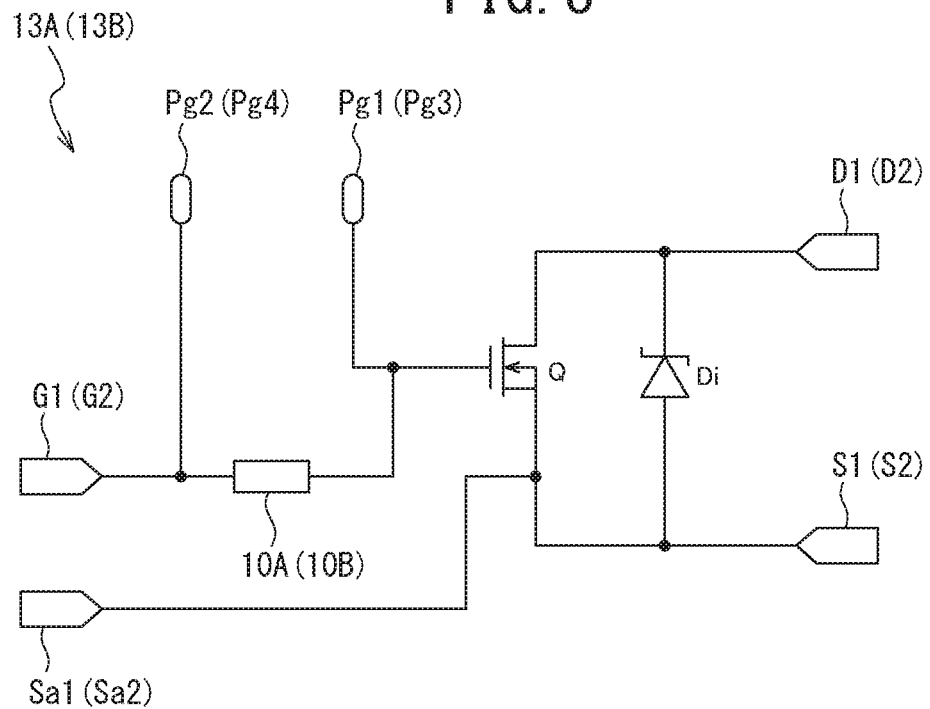
FIG. 8 is an equivalent circuit diagram of an upper arm.
Figure 9:
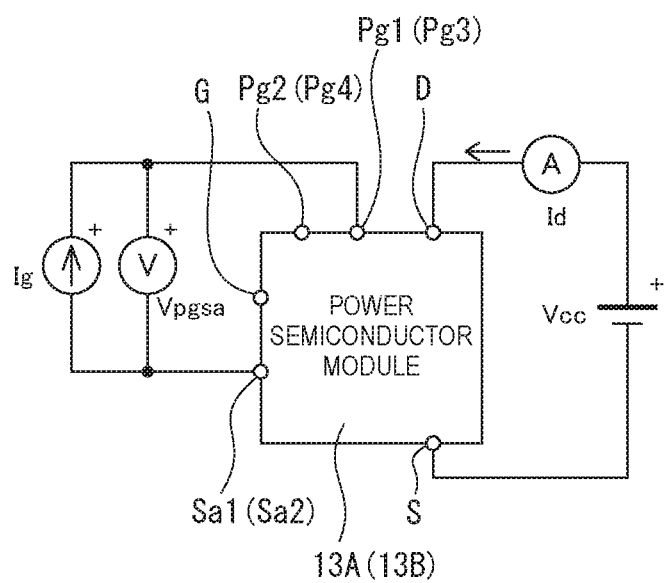
FIG. 9 is a diagram illustrating an example of a circuit structure of a measuring device in a gate characteristic measuring step.

Specifically, as illustrated in FIG. 8, for example, for the lower arm 13A in which the multiple transistor chips 4A (MOSFETs Q2a to Q2d) are mounted on the insulating substrate 3A, a constant-current source Ig is connected between the test pad Pg1 and Sa1, and a constant-voltage source Vcc is connected between D1 and S1. As a measuring device, as illustrated in FIG. 9, a device that detects a Pg1-Sa1 voltage (Vpgsa) and a drain current Id and has a function capable of sequentially recording detected values with respect to time, for example, an oscilloscope is prepared. For the current source Ig and the constant-voltage source Vcc, suitable values are determined depending on characteristics and the like of the semiconductor module to be measured.

Figure 10:
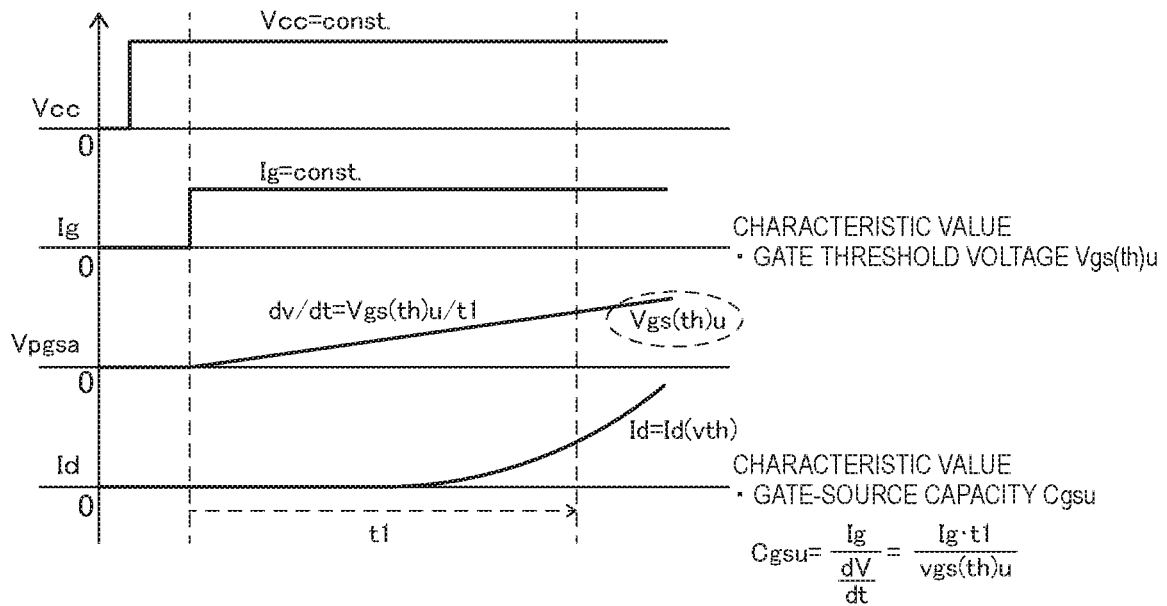
FIG. 10 is a gate characteristic measuring chart.

Referring to FIGS. 8 to 10, when the current source Ig is turned on after the voltage source Vcc is turned on (refer to FIG. 9), as illustrated in FIG. 10, the Pg1-Sa1 voltage (Vpgsa) increases in substantially proportion to elapse of time at the same time as the turn-on of the current source Ig. This is because the combined gate-source capacity (Cgsu) of the second transistor chip group including the multiple transistor chips 4A (MOSFETs Q2a to Q2d) connected in parallel in the insulating substrate 3A is filled by the constant current source, and the Pg1-Sa1 voltage (Vpgsa) substantially proportionally increases.

When the gate-source voltage increases to some degree over time, a drain (D)-source (S) channel of each of the transistor chips 4A (MOSFETs Q2a to Q2d) becomes a conduction start state, and the drain current Id starts to flow due to bias of the constant-voltage source Vcc connected between D and S. The drain current Id depends on the Pg1-Sa1 voltage (Vpgsa), and the drain current Id also increases over time due to the continuous increase in the Pg1-Sa1 voltage (Vpgsa).

The Pg1-Sa1 voltage (Vpgsa) when Id=Id (vth) is defined as the gate threshold voltage (Vgs(th)u) in this measurement, the Pg1-Sa1 voltage (Vpgsa) when arriving at Id=Id (vth) is measured, and this is assumed as the measured gate threshold voltage (Vgs(th)u) of the second transistor chip group of the lower arm 13A. In addition, the gate-source capacity (Cgsu) is determined by calculation from the measurement result (t1, Vgs(th)u) using the following equation (1).

[Math 1]

$$Cgsu = \frac{Ig}{\frac{dV}{dt}} = \frac{Ig \cdot t1}{vgs(th)u} \quad (1)$$

Next, the compensation gate resistance value (Rg_set) is determined on the basis of the gate-source voltage value (Vgs(th)u) and the gate-source capacity (Cgsu) in the elapsed time (t1). The compensation gate resistance value (Rg_set) is a gate resistance value that compensates a difference in gate threshold voltage arrival time caused by a characteristic variation in the gate-source voltage value (Vgs(th)u) and the gate-source capacity (Cgsu).

Similarly, the compensation gate resistance value (Rg_set) is determined also in the first transistor chip group including the multiple transistor chips 4A (MOSFETs Q1a to Q1d) forming the upper arm 13B. In other words, a Pg3-Sa2 voltage (Vpgsa) when arriving at Id=Id(vth) is measured, and this is assumed as the measured gate threshold voltage (Vgs(th)u) of the first transistor chip group of the upper arm 13B. Then, the gate-source capacity (Cgsu) is calculated on the basis of the measured gate threshold voltage (Vgs(th)u). Then, the compensation gate resistance value (Rg_set) is determined on the basis of the gate-source voltage value (Vgs(th)u) and the gate-source capacity (Cgsu) in the elapsed time (t1).

Next, a resistance changing step S5 illustrated in FIG. 6 is performed. In the present embodiment, the resistance values of the trimming resistance elements 10A, 10B are changed such that the gate threshold voltage arrival time of the multiple transistor chips 4A mounted on each of the insulating substrates 3A, 3B during a switching operation becomes certain constant gate threshold voltage arrival time (t_set).

Figure 11:
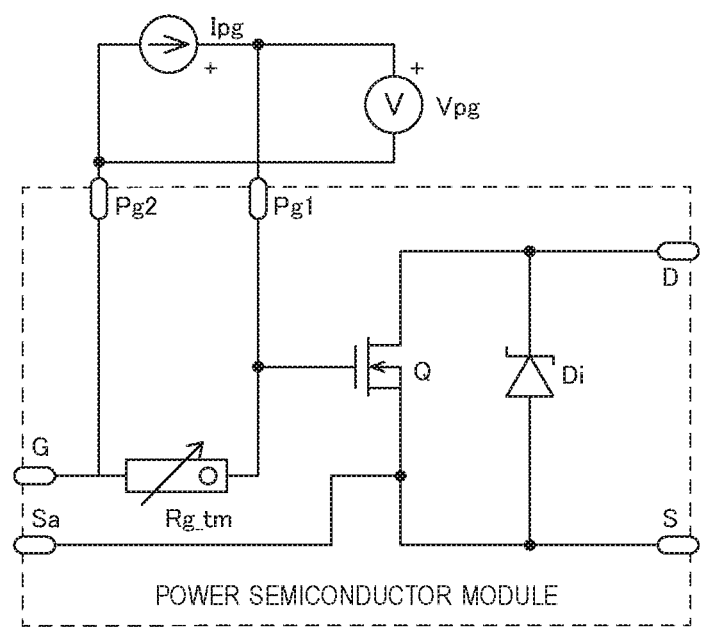
FIG. 11 is a diagram illustrating an example of a measuring circuit that measures a resistance value of a trimming resistance element.
Figure 12:
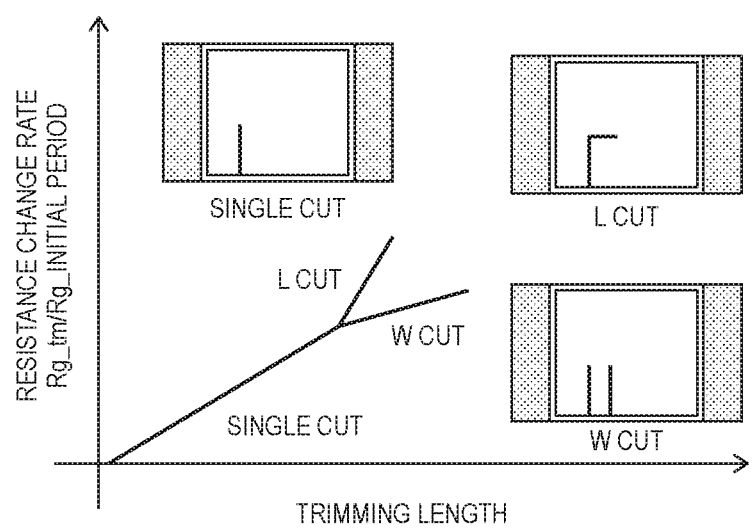
FIG. 12 is a diagram illustrating an example of trimming cut of the trimming resistance element.

FIG. 11 is a diagram illustrating an example of a measuring circuit that measures a resistance value of a trimming resistance element, and FIG. 12 is a diagram illustrating an example of trimming cut of the trimming resistance element.

As illustrated in FIG. 12, in the trimming resistance elements 10A, 10B, the resistance values can be changed by making a cut in resistance portions by laser irradiation. In FIG. 11, a current source Ipg is connected between the test pad Pg1 and the test pad Pg2, and a resistance value Rgtm (adjusted Rg) during cutting with laser is measured by measuring between the test pad Pg1 and the test pad Pg2. The adjusted Rg is given by Rgtm=Vpg/Ipg.

A correction target Rg, how much the gate resistance Rg is made finally, is determined such that the difference in the gate threshold voltage arrival time during the switching operation, which is caused by the variation in the gate threshold voltage (Vgs(th)u) and the gate-source capacity (Cgsu) of each arm, becomes certain constant gate threshold voltage arrival time. The correction target Rg can be determined by the following (2).

[Math 2]

$$Rg\_set = \frac{t\_set}{Cgsu \cdot \ln\left(1 - \frac{Vgs(th)u}{Vin}\right)} \quad (2)$$

Here, t_set is target gate threshold voltage Vth arrival time during the switching operation. In addition, Vin is a Vgs High voltage during the switching operation. Vgs(th)u is the gate threshold voltage measured in the preceding gate characteristic measuring step S4, and Cgsu is the gate-source capacity measured in the preceding gate characteristic measuring step S4.

As illustrated in FIG. 12, examples of the cutting method include L cut and W cut in addition to single cut, and all of them are adjustment from low resistance to high resistance. Thus, setting is performed in a state of Rg_tm=Rg_set in an initial state before the trimming, Rgtm increases during the trimming, and the trimming is finished when finally becoming Rg_tm=Rg_set. Preferably, the resistance value of the trimming resistance element 10A is changed while the current source Ipg is connected to the test pad Pg1 and the test pad Pg2 and the resistance value of the trimming resistance element 10A is measured. Moreover, preferably, the resistance value of the trimming resistance element 10B is also changed while the current source Ipg is connected to the test pad Pg3 and the test pad Pg4 and the resistance value of the trimming resistance element 10B is measured.

Figure 13:
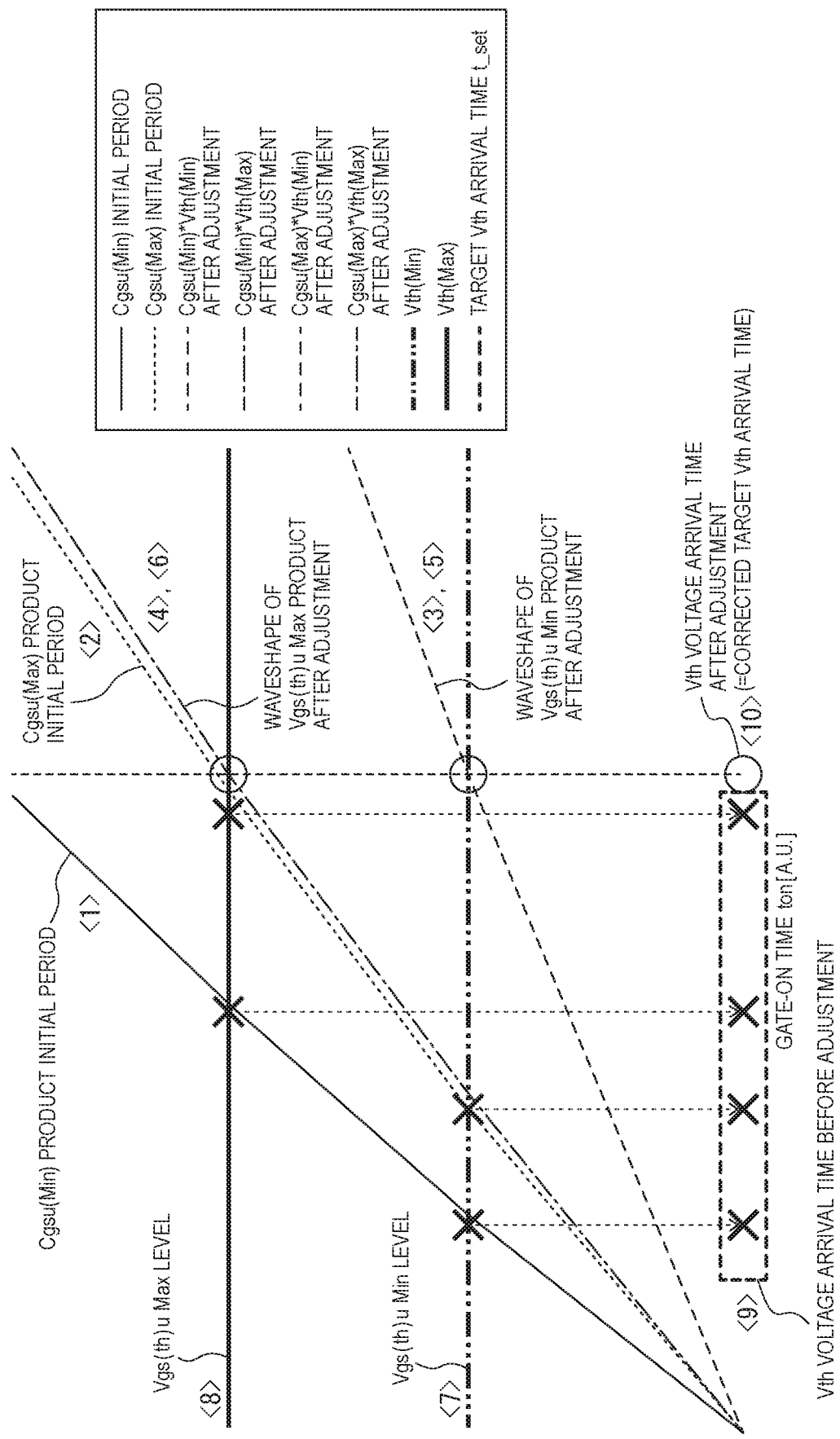
FIG. 13 is a diagram illustrating calculation results of Vgs voltage rise during a switching operation.

FIG. 13 illustrates an example of calculation results of Vgs voltage rising waveshapes (0_,Vin) during the switching operation before the trimming adjustment and after the trimming adjustment.

In the diagram, <1>indicates a waveshape when the gate-source capacity (Cgsu) before the trimming adjustment is minimum (Min), and <2>indicates a waveshape when the gate-source capacity (Cgsu) before the trimming adjustment is maximum (Max). <7> and <8>indicate minimum (Min) and maximum (Max) levels of the gate threshold voltage (Vgs(th)u). Each gate-on time determined by intersections of <1> or <2> and <7> or <8>indicates available gate threshold voltage arrival time <9>before the trimming adjustment.

Accordingly, it can be confirmed that the difference in the gate threshold voltage arrival time during the switching operation is generated due to the variation in the gate threshold voltage (Vgs(th)u) and the gate-source capacity (Cgsu) of each semiconductor module.

In the present invention, it is considered that a drain voltage and a gate voltage during the switching are oscillated due to the difference to generate a malfunction, and, even when there is a variation in the gate threshold voltage (Vgs(th)u) and the gate-source capacity (Cgsu) in the arms 13A, 13B, the gate resistance values are changed (adjusted) by the trimming such that the arms 13A, 13B have the same gate threshold voltage arrival time during the switching operation. The correction target resistance (Rg_set) is determined by the above equation (2).

The target gate threshold voltage (Vth) arrival time (t_set) during the switching operation is time constant in the semiconductor modules and needs to be suitably determined. It is assumed that the arrival time (t_set) can be adjusted (can be changed) within a possible range of the variation in the gate threshold voltage (Vgs(th)u) and the gate-source capacity (Cgsu), and thus the arrival time (t_set) needs to be set to be equal to or more than gate threshold voltage arrival time appearing in possible gate threshold voltage (Vgs(th)u) maximum value×gate-source capacity Cgus maximum value.

In the diagram, <3>, <4>, <5>, and <6>indicate the Vgs voltage rising waveshapes (0_,Vin) during the switching operation after the trimming adjustment. <3> and <5>, and <4> and <6> are respectively substantially the same, <3> and <5>indicate the waveshapes after the trimming adjustment when the gate threshold voltage (Vgs(th)u) is minimum (Min), and <4> and <6>indicate the waveshapes after the trimming adjustment when the gate threshold voltage (Vgs(th)u) is maximum (Max).

Each gate-on time determined by an intersection of <3> or <5> and <7> and an intersection of <4> or <6> and <8>indicates gate threshold voltage arrival time after the trimming adjustment, and it can be confirmed that all are the same <10> and are adjusted like the target gate threshold voltage arrival time (t_set).

In the two elements-package (2 in 1) type semiconductor module 2, each arm (unit) includes the trimming resistance element 10A, 10B. Thus, a gate threshold voltage difference between the first transistor chip group of the upper arm 13B and the second transistor chip group of the lower arm 13A may be adjusted by changing (adjusting) both resistance values of the two trimming resistance elements 10A, 10B, and preferably, the resistance of the trimming resistance element in the arm having a lower gate threshold voltage of the two arms 13B, 13A is changed.

Next, a resin sealing step S6 illustrated in FIG. 6 is performed. Specifically, a structure including the insulating substrates 3A, 3B, the transistor chips 4A, the diode chips 4B, the wiring substrate 5, the cylindrical conductive posts 17a, 17b, 17s, and the trimming resistance elements 10A, 10B is arranged in a cavity of a molding die, and then, for example, an epoxy resin material that is a thermosetting resin is injected into the cavity. Accordingly, the resin seal 24 that seals the insulating substrates 3A, 3B, the transistor chips 4A, the diode chips 4B, the wiring substrate 5, the cylindrical conductive posts 17a, 17b, 17s, and the trimming resistance elements 10A, 10B is formed. The resin seal 24 is formed to have a rectangular shape. The semiconductor module 2 is manufactured by these steps.

The external terminals 21a, 21b, 22a, 22b of the semiconductor module 2 are connected to a driving circuit, so that one phase of an inverter circuit can be formed. Furthermore, three semiconductor modules are combined, so that three-phase inverter circuit having a U phase, a V phase, and a W phase can be formed.

As described above, according to the manufacturing method of the semiconductor module 2 of the present embodiment, even when there is a variation in the gate threshold voltage (Vgs(th)u) and the gate-source capacity (Cgsu) in the arms, the oscillation of the drain voltage and the gate voltage during the switching can be suppressed, and the malfunction of the semiconductor module 2 can be prevented.

In addition, the number of steps of characteristic sorting, identification, inventory management, and the like of the transistor chips due to the variation in the gate threshold voltage Vgs(th)u and the gate-source capacity (Cgsu) can be reduced, and cost reduction of the semiconductor module 2 can be achieved.

Figure 14:
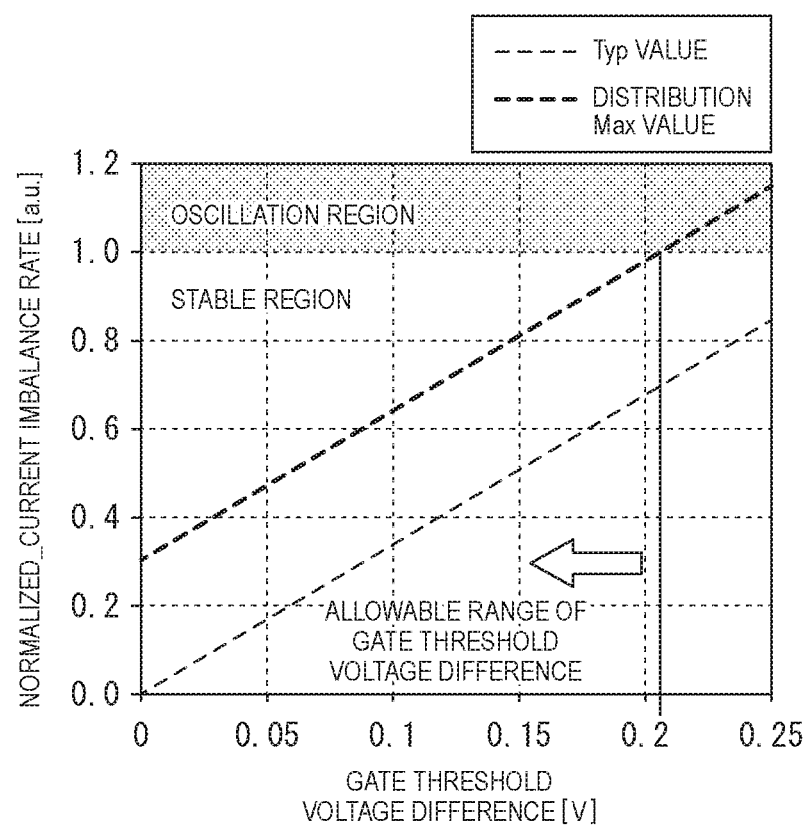
FIG. 14 is a diagram illustrating a relation between a normalized current imbalance rate [a.u.] and a gate threshold voltage [V].

The inventor researched allowable ranges of the gate threshold voltage difference affecting the oscillation during the switching operation and found that the allowable range of the gate threshold voltage difference of SiC transistor chips is narrower than the allowable range of the gate threshold voltage difference of conventional Si transistor chips mainly formed of a substrate made of silicon. The inventor found that a predetermined range of the gate threshold voltages of the transistor chips 4A is preferably ranked at 0.2 V or less. FIG. 14 is a diagram illustrating a relation between a normalized current imbalance rate [a.u] and a gate threshold voltage difference [V] in SiC transistor chips. The gate threshold voltage difference is a width of a variation in the gate threshold voltages of multiple transistor chips used in one arm. The cause of the oscillation during the switching operation includes not only the gate signal (voltage) but also the drain voltage and the drain current, and thus, put briefly, relates to the current imbalance rate (%) of the chips. Therefore, by limiting the gate threshold voltage difference as a parameter of the current imbalance rate (%) to a certain value or less, the malfunction due to the oscillation can be prevented. As illustrated in FIG. 14, the current imbalance rate (%) is in a stable region at the gate threshold voltage difference of 0.2 [V] or less.

Therefore, it is found that the gate threshold voltage difference in the first transistor chip group including the multiple transistor chips 4A (MOSFETs Q1a to Q1d) forming the upper arm 13B and the gate threshold voltage difference in the second transistor chip group including the multiple transistor chips 4A (MOSFETs Q2a to Q2d) forming the lower arm 13A are preferably 0.2 [V] or less.

For example, the transistor chips cut out from the wafer are ranked into groups in which the gate threshold voltage difference is 0.2 V or less. Multiple transistor chips are connected in parallel in each rank to form a transistor chip group for one arm. In other words, the semiconductor module is formed to include the upper arm 13B having the first transistor chip group in which the multiple transistor chips 4A are connected in parallel in one rank and the lower arm 13A having the second transistor chip group in which the multiple transistor chips 4A are connected in parallel in one rank. For example, the upper arm 13B is formed using the transistor chips 4A having a low gate threshold voltage, and the lower arm 13A is formed using the transistor chips 4A having a high gate threshold voltage. The resistance value of the trimming resistance element 10A electrically connected to the gate electrodes of the lower arm 13A and/or the resistance value of the trimming resistance element 10B electrically connected to the gate electrodes of the upper arm 13B are/is changed, so that the gate threshold voltage value in the upper arm 13B is conformed to the gate threshold voltage value in the lower arm 13A. Accordingly, the corrected gate threshold voltage values viewed from a gate drive circuit connected to the G1, G2 terminals can be made to be a unified value through the trimming resistance elements even when the transistor chips 4A in ranks whose gate threshold voltage values are relatively different are used.

In a conventional semiconductor device without using the trimming resistance elements 10A, 10B, transistor chips sorted in a rank in which the number that can be obtained from one semiconductor wafer is relatively small due to a manufacturing variation are likely to become products-in-process with long retention time. However, by applying the manufacturing method of the semiconductor module in the present embodiment, the influence of a difference in the rank of transistor chips can be alleviated by the trimming resistance, and thus transistor chip groups in different ranks can be mixed in the semiconductor module. Therefore, the retention time of the products-in-process can be shortened, and the cost reduction of the semiconductor module 2 can be achieved.

Although the manufacturing method of the two elements-package (2 in 1) type semiconductor module has been described in the above embodiment, the present invention is not limited to the manufacturing method of the two elements-package (2 in 1) type semiconductor module. In other words, the present invention can also be applied to a one element-package (1 in 1) type semiconductor module (semiconductor unit). In this case, the manufacturing method of the semiconductor module includes a step of measuring elapsed time (t1) when a predetermined gate current is injected into multiple gate electrodes and a predetermined drain current flow and a gate-source voltage value (Vgs(th)u) at the time, a step of calculating a gate-source capacity on the basis of the gate-source voltage value, a step of determining a compensation gate resistance value on the basis of the gate-source voltage value and the gate-source capacity, and a step of changing a resistance value of a trimming resistance element such that the resistance value of the trimming resistance element is conformed to the compensation gate resistance value.

Moreover, although the case where power MOSFETs are used for the transistor chips 4A has been described in the above embodiment, without limiting thereto, IGBTs may be used for the transistor chips 4A. In this case, the source electrode and the drain electrode in the above embodiment may be replaced with an emitter electrode and a collector electrode, respectively. Moreover, another voltage control type semiconductor element may be used.

In addition, the external terminal 22a may be used as a test pad in place of the first metal layer 16g, and the external terminal 22b may be used as a test pad in place of the first metal layer 16l.

REFERENCE SIGNS LIST 2 semiconductor module
3A, 3B insulating substrate
3a insulating plate
3b circuit plate
3c metal plate
4A first semiconductor chip
4B second semiconductor chip
4g gate electrode
4s source electrode
5 wiring substrate
10A, 10B trimming resistance element
13A lower arm
13B upper arm
14 circuit plate
15 positioning post
16 metal layer
17a, 17b, 17e, 17g, 17s conductive post
18, 19, 20, 21a, 21b, 22a, 22b external terminal
24 resin seal

The invention claimed is:

1. A manufacturing method of a semiconductor module comprising:
mounting on a substrate in each of a respective first arm and a respective second arm a trimming resistance element and a plurality of transistor chips connected mutually in parallel, in which gate electrodes are connected to one end of the trimming resistance element;
for the trimming resistance element and plurality of transistor chips mounted in each of the respective first arm and the respective second arm:
measuring a gate characteristic of the gate electrodes comprising:
measuring elapsed time when a predetermined gate current is injected into the gate electrodes, and a gate-source voltage value (Vgs(th)u) and a predetermined drain current flow,
calculating a gate-source capacity (Cgsu) on the basis of the measured gate-source voltage value, and
determining a compensation gate resistance value on the basis of the gate-source voltage value and the gate-source capacity after the elapsed time; and
adjusting a resistance value based on the measured gate characteristic comprising changing a resistance value of the trimming resistance element such that the resistance value of the trimming resistance element conforms to the compensation gate resistance value; and
sealing the semiconductor module by a resin.

2. The manufacturing method of a semiconductor module according to claim 1, wherein
the compensation gate resistance value is a gate resistance value that compensates a difference in gate threshold voltage arrival time caused by a characteristic variation in the gate-source voltage value and the gate-source capacity.

3. The manufacturing method of a semiconductor module according to claim 1, wherein
the changing the resistance value of the trimming resistance element is performed while the resistance value of the trimming resistance element is measured.

4. The manufacturing method of a semiconductor module according to claim 1, wherein
the changing the resistance value of the trimming resistance element is performed by making a cut in a resistance portion of the trimming resistance element by laser irradiation.

5. The manufacturing method of a semiconductor module according to claim 1, wherein
each of the respective first arm and the respective second arm of the semiconductor module further includes a branch wire for connecting the gate electrodes of the plurality of transistor chips in parallel to the one end of the trimming resistance element, a first test pad electrically connected to the branch wire, and a second test pad electrically connected to another end of the trimming resistance element, the manufacturing method comprising:
measuring the resistance value of the trimming resistance element by connecting a current source to the first test pad and the second test pad.

6. The manufacturing method of a semiconductor module according to claim 1, comprising, before the measuring the gate-source voltage value:
measuring gate threshold voltages of the plurality of transistor chips before being mounted on a substrate for the semiconductor module;
sorting the number of the plurality of transistor chips whose differences of the gate threshold voltages are within a predetermined range, which is required for being mounted on the substrate; and
mounting the plurality of transistor chips sorted in the sorting on the substrate.

7. The manufacturing method of a semiconductor module according to claim 6, wherein
the plurality of transistor chips are SiC chips mainly formed of a substrate made of silicon carbide, and
the predetermined range of the differences of the gate threshold voltages of the SiC chips is 0.2 V or less.

8. A method of manufacturing a plurality of semiconductor modules each semiconductor module of the plurality of semiconductor modules including a trimming resistance element, a plurality of transistor chips connected mutually in parallel, in which gate electrodes are connected to one end of the trimming resistance element, and a substrate on which the plurality of transistor chips are mounted, comprising:
for each semiconductor module of the plurality of semiconductor modules:
measuring gate threshold voltages of the plurality of transistor chips before being mounted on the substrate;
sorting the number of the plurality of transistor chips whose differences of the gate threshold voltages are within a predetermined range, which is required for being mounted on the substrate;
mounting the plurality of transistor chips sorted in the sorting on the substrate;
measuring a gate characteristic of the gate electrodes including gate threshold voltage arrival time of the plurality of transistor chips mounted on the substrate during a switching operation;
changing a resistance value of the trimming resistance element such that the gate threshold voltage arrival time of the plurality of transistor chips mounted on the substrate during a switching operation is common among the plurality of semiconductor modules; and sealing each of the semiconductor modules by a resin.

9. The method according to claim 8, wherein the plurality of transistor chips are SiC chips mainly formed of a substrate made of silicon carbide, and the predetermined range of the differences of the gate threshold voltages of the SiC chips is 0.2 V or less.

\* \* \* \* \*